March 28, 1967 R. R. FREELAND 3,311,848
TRANSISTOR CRYSTAL OSCILLATOR WITH PI FILTER FEEDBACK
Filed March 8, 1965
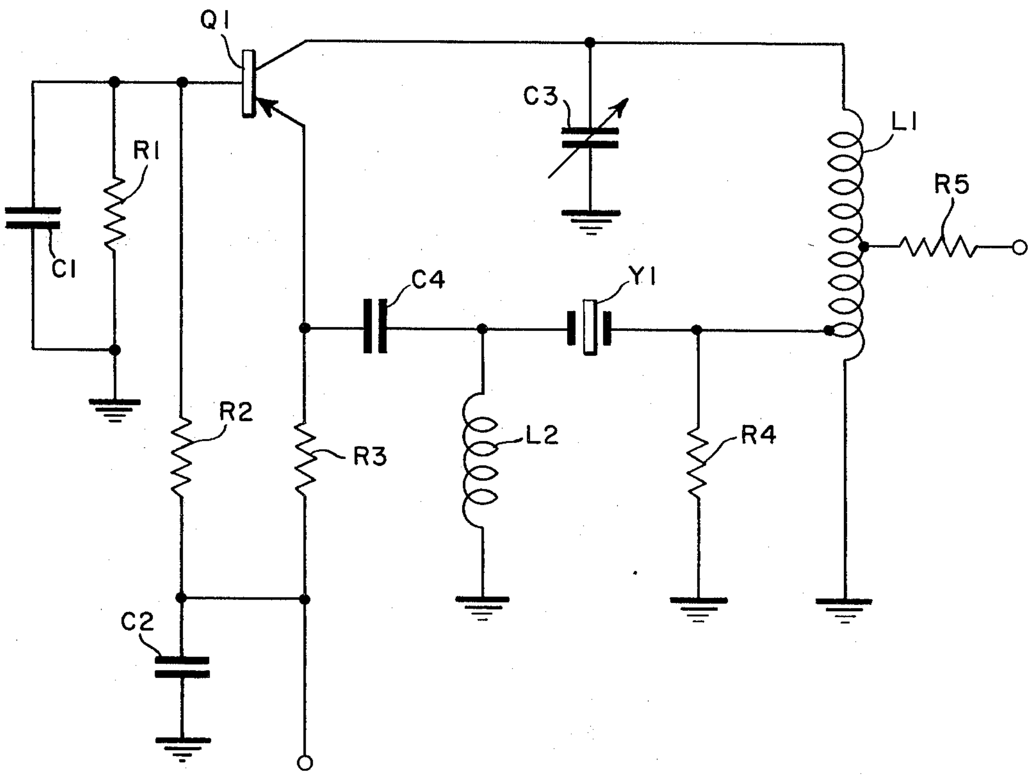
INVENTOR
ROYDEN R. FREELAND
BY Stevens, Davis, Miller & Mosher
ATTORNEYS

United States Patent Office 3,311,848

Patented Mar. 28, 1967

3,311,848
TRANSISTOR CRYSTAL OSCILLATOR WITH PI FILTER FEEDBACK

Royden R. Freeland, Oklahoma City, Okla., assignor to International Crystal Manufacturing Co., Inc., Oklahoma City, Okla., a corporation of Oklahoma Filed Mar. 8, 1965, Ser. No. 437,992
3 Claims. (Cl. 331—116)

The present invention concerns crystal-control means for use in stabilizing the frequency of an oscillator circuit in electronic devices, such as a radio transmitter.

A problem has arisen in previous transistorized crystal transmitters. The problem is to operate the crystal in the overtone mode while having its output effectively coupled to the input of the transistor and its input effectively coupled or even connected directly to an output tank circuit.

The invention solves the problem by providing a short circuit for the fundamental feedback frequency, from the output tank circuit at the input to the crystal by using an L–C bandpass filter circuit. The crystal and holder capacity are used for the series element and inductor $L_2$ and part of $L_1$, with circuit capacitance, form the matching sections. Resistor $R_4$ maintains an approximate match at the filter input as capacitor $C_3$ varies.

It is therefore an object of the present invention to provide an improved transistorized crystal oscillator which will operate in the overtone mode.

Another object of the present invention is to provide a transistorized crystal oscillator which may be economically and readily produced.

The means by which the foregoing objects and other advantages, which will be apparent to those skilled in the art, are accomplished are set forth in the following specification and claims and are illustrated in the accompanying drawing dealing with a basic embodiment of the present invention.

Reference is made now to the drawing in which the invention is shown as a transistorized crystal oscillator. $Q_1$ represents a PNP transistor having a base bias circuit comprising capacitor $C_1$ and resistor $R_1$ connected in parallel between ground and the base of $Q_1$ and $R_2$ which is connected between $C_1R_1$ and the base of $Q_1$ and is in series with $C_2$ to ground. Capacitor $C_2$ forms a supply bypass.

The collector of $Q_1$ is connected to an output tank circuit comprising variable capacitor $C_3$ and coil $L_1$. The output tank circuit is resonant in the range of the desired oscillation. Resistor $R_5$ is connected to the output of the tank circuit and is a load-limiting resistor. Resistor $R_3$ is connected between an input and the emitter of $Q_1$ and serves as an emitter bias and feedback resistor. Resistor $R_4$ is connected between the crystal $Y_1$ input and the coil of the output tank circuit. This resistor serves to limit and clamp variation in driving impedance to the bandpass network.

Crystal $Y_1$ is of the third, fifth, seventh, ninth, etc. mode overtone type and is capacitively coupled to the emitter of $Q_1$ through capacitor $C_4$ and directly coupled to coil $L_1$. The high frequency mounting capacitance tends to cut off the feedback through the crystal. The prior art treated the feedback as a whole and provided a large shunting coil to eliminate this capacitance. The invention recognizes the fact that the feedback may be treated by its components and therefore provides an inductor $L_2$ connected between ground and the output of the crystal. The coil $L_2$ acts as part of a constant $K\pi$ section bandpass filter and a crystal frequency trimmer by varying the output load of the network. The coil $L_2$ is actually in parallel with some of the inherent circuit capacitance. The crystal and holder make up the series arm of the section. The network short circuits to ground the feedback below the feedback frequency and continues shunting the feedback to ground as the frequency continues to increase above the desired range. This circuit is somewhat broadbanded by $R_4$ and may be further broadbanded by the appropriate addition of more resistance.

Previous circuits have employed a coil connected in parallel with the crystal. However, the coil in parallel antiresonates the holder capacitance at the frequency range of the desired feedback. In the invention, a bandpass network having a constant K input and output is formed, with the crystal forming the series arm. At frequencies other than the set desired series resonate, the invention will attenuate the feedback as well as cause a shift in phase to prevent oscillation. Coil $L_1$ and capacitor $C_3$ tune in the desired oscillating range, the "Q" of the circuit changing with variation of $C_3$, and resistor $R_4$ helps to limit the variation presented to the input of the bandpass filter network. Changes in $L_2$ will vary the reactance reflected into the crystal and therefor vary its series resonate frequency slightly.

The above-described transistorized crystal oscillator therefore provides for an oscillator having only the crystal frequency appearing in the feedback loop so that direct frequency control may be obtained.

The invention may be embodied in other specific forms without departing from the spirit or central characteristics thereof. The present embodiment is therefore to be considered in all respects as illustrative and not restrictive, the scope of the invention being indicated by the appended claims rather than the foregoing description, and all changes which come within the meaning and range of equivalency in the claims are therefore to be embraced therein.

1. A transistorized crystal control oscillator circuit adapted to selectively generate an alternating current output of any frequency and phase within a frequency phase band of predetermined widths including one preselected frequency and phase and frequencies and phases greater than said one preselected frequency, said oscillator circuit including a transistor having a base, emitter and collector, and an inductance-capacitance output tank circuit coupled between the collector of said transistor and ground, a piezoelectric crystal having input and output terminals, said input terminal being connected to a tap of the inductance of said output tank circuit and said output terminal being capacitively coupled to the emitter of said transistor, a base bias circuit connected to the base of said transistor, means for biasing the emitter and feedback connected to the emitter of said transistor, and inductor means having one end connected between said crystal and said emitter and the other end connected to ground, the portion of said inductance between the tap and ground, the crystal, and the inductor means acting as part of a constant $K\pi$ section bandpass filter, where K is a constant, and a crystal frequency trimmer by varying the output load of the network, thereby providing a shunt to ground for the crystal fundamental frequency as well as a feedback path for the circuit.

2. A transistorized crystal control oscillator circuit according to claim 1 in which said inductor is connected between said capacitive coupling and the output terminal of said crystal.

3. A transistorized crystal control oscillator circuit according to claim 1 in which a resistor is connected at one end between said crystal input terminal and the inductance of said output tank circuit and at the other end to ground, said resistor giving said bandpass filter broadened characteristics.

(References on following page)

References Cited by the Examiner

UNITED STATES PATENTS

| | | | |
|---|---|---|---|
| 3,108,223 | 10/1963 | Hunter | 331—116 |
| 3,233,192 | 2/1966 | Smith | 331—116 |

OTHER REFERENCES

Stoner, CQ, "Semiconductors," page 70, May 1959, and page 71, February 1961.

Bennett et al., Electronics, "Circuits for Space Probes," page 56, June 19, 1959.

Buchanan, Handbook of Piezoelectric Crystals For Radio Equipment Designers, December 1954, TK, 6565, Q7P5, C.2, pages 271–273.

ROY LAKE, *Primary Examiner.*

JOHN KOMINSKI, NATHAN KAUFMAN, *Assistant Examiners.*